United States Patent [19]

Gottwals

[11] 4,331,285
[45] May 25, 1982

[54] METHOD FOR FABRICATING A MAGNETIC SHIELDING ENCLOSURE

[75] Inventor: David F. Gottwals, Cupertino, Calif.

[73] Assignee: Hewlett-Packard Company, Palo Alto, Calif.

[21] Appl. No.: 132,748

[22] Filed: Mar. 24, 1980

[51] Int. Cl.³ .................. B23K 11/10; H05K 9/00
[52] U.S. Cl. ........................ 228/173 C; 228/184; 174/35 R; 220/408
[58] Field of Search .................. 228/184, 173 C; 174/35 R, 35 MS; 220/408; 29/469; 365/1; 113/116 W, 120 E, 120 G

[56] References Cited
U.S. PATENT DOCUMENTS

| | | | |
|---|---|---|---|
| 2,488,710 | 11/1949 | Cooper | 174/35 MS |
| 3,931,618 | 1/1976 | Lacey | 365/1 X |
| 4,072,787 | 2/1978 | Ricks | 228/184 X |

Primary Examiner—R. L. Spruill
Assistant Examiner—K. Y. Lin
Attorney, Agent, or Firm—Edward Y. Wong

[57] ABSTRACT

A magnetic shielding enclosure is fabricated by a simple method of folding magnetically permeable material to provide essentially a gapless two-layered shield with small corner and edge radii.

5 Claims, 2 Drawing Figures

METHOD FOR FABRICATING A MAGNETIC SHIELDING ENCLOSURE

BACKGROUND AND SUMMARY OF THE INVENTION

This invention provides an improved method for fabricating magnetic shielding for critical electronic components which are sensitive to stray magnetic fields.

In the prior art, the usual method of protecting critical electronic components that are sensitive to stray magnetic fields is to shield these components with an enclosure comprising high magnetically permeable or conductive material, such as mu-metal. These enclosures may be fabricated by deep drawing. This technique requires expensive equipment and tooling and results in an enclosure that has large corner and edge radii. For instance, see the housing depicted in U.S. Pat. No. 3,931,618. Still another technique is to cut and fold into a box a single sheet of the high magnetic conductive shielding material. To prevent magnetic leakage at the corners and edges of the box, they are usually welded along the seams and corner. In this process, the magnetic shielding properties of the shielding material is greatly distorted and degraded by the welding. Furthermore, welding is a costly process.

The apparatus fabricated by the method in accordance with the invention overcomes these problems in the prior art. The apparatus comprises overlapping sheets of shielding material to provide an essentially gapless enclosure without welding. At least one sheet overlaps each other opening or abutment of the sheets above or below it. Furthermore, the corners and edges are formed sharply. As a result, the enclosure is a closely and tightly fitting shield. For providing better mechanical stability, the overlapping sheets can be mutually attached by spot welds. Therefore, the shielding material is substantially undegraded as it would be with more extensive welding. And because of the overlapping layers, superior shielding property is realized especially when the shielded component is confronted with a strong field which must be reduced to a minimum value. A common solution in such cases is to use a double-layered shield.

DETAILED DESCRIPTION OF THE INVENTION

Figure 1:
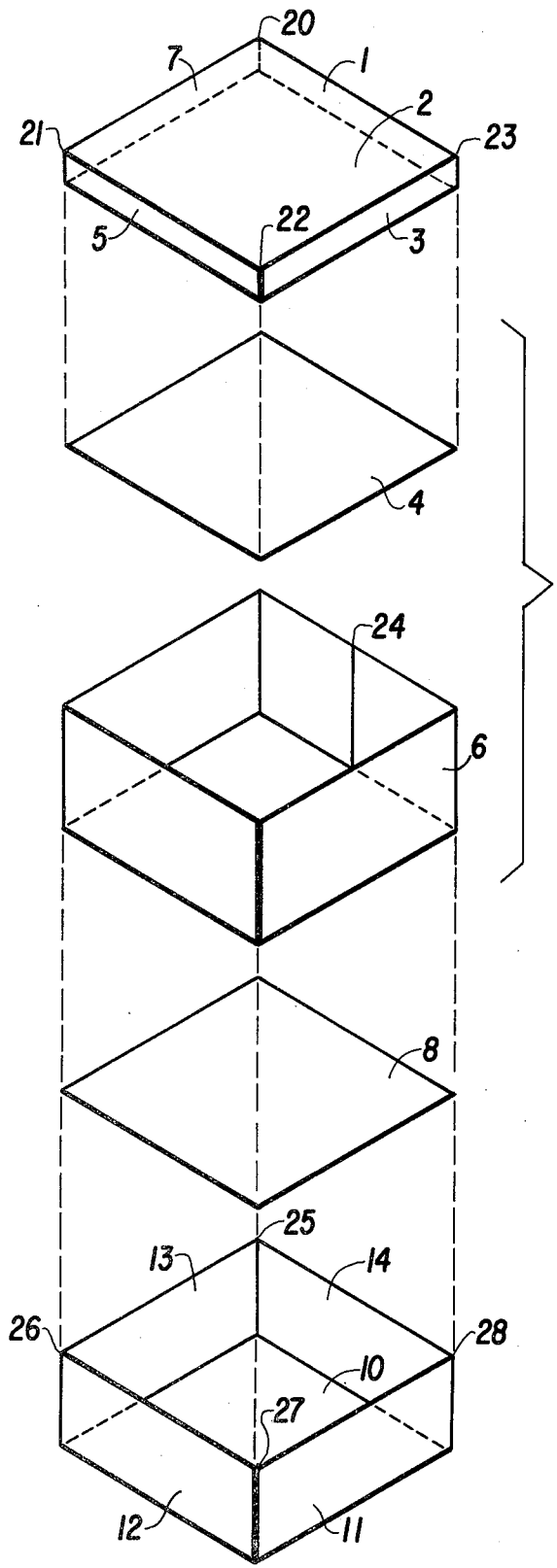
FIG. 1 illustrates the individual sheet that comprise the lid and container of a magnetic shielding enclosure.

Suppose a volume of height h, width w, and length l, is to be magnetically shielded in an enclosure. A container and a tightly fitting lid, both of which are fabricated from shielding material such as mu-metal and which form an enclosure of approximate dimensions of height h, length l, and width w, can be used. Five separate sheets of the magnetic shielding material can be used in fabricating the enclosure. As shown in FIG. 1, two sheets 2, 4 are used to form the lid, and three sheets, 6, 8, 10 are used to form the container. Sheets 4 and 8 are both made to be approximately l×w; these sheets form an optional second layer of shielding material for the lid and container, respectively.

Sheet 2 has the dimension of l×w with flaps 1, 3, 5, 7 of excess material on the four sides to form a lip such that the width of the lip and the height of the container formed with sheet 10 together are substantially equivalent to h, the height of the volume to be shielded. The flaps of excess material are bent to form the lip of a resulting lid having dimensions substantially l×w. Optional sheet 4 fits inside the lid. It can be attached to the lid, such as by spot welding, for better magnetic conductivity between them.

Sheet 6 has the dimension of substantially h×2(l×w), that is, its width is substantially the height of the volume to be enclosed, and its length is sufficient to wrap around the volume (2l×2w).

Figure 2:
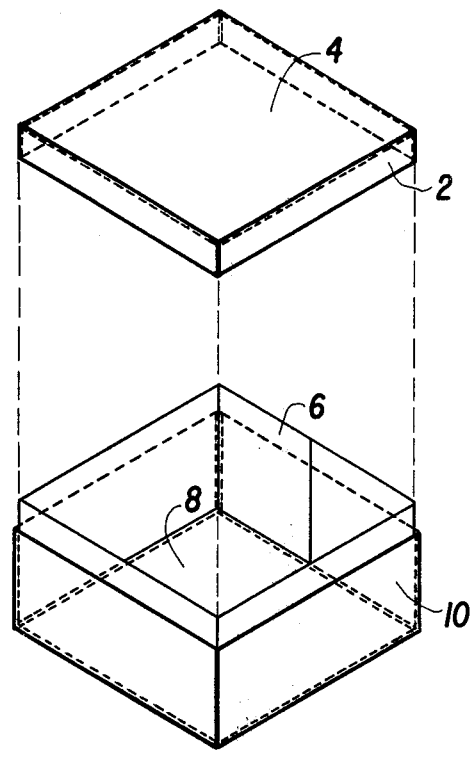
FIG. 2 shows the fabricated lid and container that comprise the enclosure.

Sheet 6 is bent such that the seam ends up in the center of one side. Sheet 10 is formed similarly to the lid; rectangles of the material are cut out from the corners to form flaps 11-13 of excess material on the sides. The excess material is folded up to form the sides of the container. Inside the container formed folded Sheet 6 can be attached to the sides, e.g., by spot welding at appropriate places to provide better magnetic conductivity between Sheet 6 and the container. The completed lid and container comprise an enclosure as shown in FIG. 2, thus providing a gapless magnetic shield enclosure with sharp corners and edges. Note that there are no gaps or openings that are not covered by another piece. Specifically, folded Sheet 6 is oriented such that it overlaps and covers gaps 20-23 in lid 2. Its own gap 24 in turn is partially covered by a portion of the lip 1 to the lid. Sheet 6 also serves to cover gaps 25-27 in container 10. The remaining part of gap 24 in turn is covered by overlapping wall 14 of the container. The enclosure formed then is a magnetic shield essentially without exposed gaps or seams.

I claim:

1. A method of fabricating a magnetic shield enclosure of magnetically permeable material such as mu-metal comprising the steps of:

providing a first sheet of magnetically permeable material having a rectangular configuration with side flaps extending therefrom, and folding said flaps at right angles to said first sheet to form a container having a gap between each adjacent side;

providing a second piece of magnetically permeable material having said rectangular configuration and with side flaps extending therefrom, and folding said flaps at right angles to said second sheet to form a lid having a gap between each adjacent side;

providing a third piece of magnetically permeable material having a length substantially equal to the inside periphery of said container and a width substantially equal to the combined heights of said container and lid;

folding said third piece at four locations spaced along its length such that it substantially conforms to the inside periphery of said container with a gap disposed along one side; and inserting said third piece within said container and lid to complete an enclosure wherein the gaps of said container and lid are non-coincident with the gap of said third piece.

2. The method of fabricating an enclosure of magnetically permeable material as in claim 1 and further comprising the step of attaching said folded third piece to said container.

3. The method of fabricating an enclosure of magnetically permeable material as in claim 2, wherein attaching said third piece to said container is by spot welding.

4. The method of fabricating an enclosure of magnetically permeable material as in claim 2, further comprising the steps of:

attaching a fourth piece of magnetically permeable material which substantially covers the inside bottom of said container to provide a second layer of shielding; and attaching a fifth piece of magnetically permeable material which substantially covers the inside bottom of said lid to provide a second layer of shielding.

5. The method of fabricating an enclosure of magnetically permeable material as in claim 4, wherein said attaching steps are by spot welding.

* * * * *

UNITED STATES PATENT AND TRADEMARK OFFICE
CERTIFICATE OF CORRECTION

PATENT NO. : 4,331,285
DATED : May 25, 1982
INVENTOR(S) : David F. Gottwals

It is certified that error appears in the above-identified patent and that said Letters Patent are hereby corrected as shown below:

Column 1, line 49, "sheet" should read --sheets--;

Column 2, line 11, at end of line,"(1xw)" should read --(1+w)--;

Column 2, line 14, "(21x2w)" should read --(21+2w)--.

Signed and Sealed this

Twenty-sixth Day of October 1982

[SEAL]

Attest:

GERALD J. MOSSINGHOFF

Attesting Officer

Commissioner of Patents and Trademarks